United States Patent
Galy et al.

(10) Patent No.: US 9,035,349 B2
(45) Date of Patent: May 19, 2015

(54) BIDIRECTIONAL SEMICONDUCTOR DEVICE FOR PROTECTION AGAINST ELECTROSTATIC DISCHARGES, USABLE ON SILICON ON INSULATOR

(71) Applicant: STMicroelectronics SA, Montrouge (FR)

(72) Inventors: Philippe Galy, Le Touvet (FR); Nicolas Guitard, Allevard (FR); Thomas Benoist, Grenoble (FR)

(73) Assignee: STMicroelectronics, S.A., Montrouge (FR)

( * ) Notice: Subject to any disclaimer, the term of this patent is extended or adjusted under 35 U.S.C. 154(b) by 51 days.

(21) Appl. No.: 13/768,730

(22) Filed: Feb. 15, 2013

(65) Prior Publication Data
US 2013/0214326 A1 Aug. 22, 2013

(30) Foreign Application Priority Data

Feb. 17, 2012 (FR) ...................................... 1251473

(51) Int. Cl.
*H01L 29/74* (2006.01)
*H01L 27/02* (2006.01)
*H01L 29/87* (2006.01)

(52) U.S. Cl.
CPC ........ *H01L 29/7424* (2013.01); *H01L 27/0262* (2013.01); *H01L 29/87* (2013.01)

(58) Field of Classification Search
CPC ............................ H01L 29/7424; H01L 29/87
USPC ................. 257/355–363, 173, 162, 168, 546,
257/109–111, 170, 112, 140
See application file for complete search history.

(56) References Cited

U.S. PATENT DOCUMENTS

| 5,349,229 | A | 9/1994 | Wei et al. |
| 6,864,537 | B1 | 3/2005 | Mallikarjunaswamy |
| 7,560,777 | B1 | 7/2009 | Salman et al. |
| 2002/0017654 | A1 | 2/2002 | Lee et al. |
| 2003/0075726 | A1 | 4/2003 | Ker et al. |
| 2003/0205761 | A1* | 11/2003 | Chang ........................... 257/355 |
| 2006/0286753 | A1 | 12/2006 | Barthelmess et al. |
| 2007/0052058 | A1 | 3/2007 | Hirler et al. |
| 2007/0170512 | A1 | 7/2007 | Gauthier, Jr. et al. |

(Continued)

FOREIGN PATENT DOCUMENTS

WO        WO 01/61759        8/2001

OTHER PUBLICATIONS

Webster, J.G., "Thyristor Types," The Wiley Encyclopedia of Electrical and Electronics Engineering, John Wiley & Sons, Inc., Mar. 1999, pp. 213-219.

*Primary Examiner* — Kyoung Lee
*Assistant Examiner* — Ratisha Mehta
(74) *Attorney, Agent, or Firm* — Slater & Matsil, L.L.P.

(57) ABSTRACT

A device includes, within a layer of silicon on insulator, a central semiconductor zone including a central region having a first type of conductivity, two intermediate regions having a second type of conductivity opposite to that of the first one, respectively disposed on either side of and in contact with the central region in order to form two PN junctions, two semiconductor end zones respectively disposed on either side of the central zone, each end zone comprising two end regions of opposite types of conductivity, in contact with the adjacent intermediate region, the two end regions of each end zone being mutually connected electrically in order to form the two terminals of the device.

22 Claims, 8 Drawing Sheets

(56) References Cited

U.S. PATENT DOCUMENTS

| | | | |
|---|---|---|---|
| 2007/0262386 A1* | 11/2007 | Gossner et al. | 257/355 |
| 2010/0149882 A1* | 6/2010 | Shum et al. | 365/185.33 |
| 2010/0171149 A1 | 7/2010 | Denison et al. | |
| 2010/0270614 A1 | 10/2010 | Croce et al. | |
| 2011/0068364 A1 | 3/2011 | Abou-Khalil et al. | |

* cited by examiner

BIDIRECTIONAL SEMICONDUCTOR DEVICE FOR PROTECTION AGAINST ELECTROSTATIC DISCHARGES, USABLE ON SILICON ON INSULATOR

This application claims priority to French Patent Application No. 1251473, which was filed on Feb. 17, 2012 and is incorporated herein by reference.

TECHNICAL FIELD

The invention relates to integrated circuits, and in particular to bidirectional semiconductor devices for protection against electrostatic discharges (ESD: Electrostatic Discharge), manufactured using CMOS technology within a silicon on insulator substrate (SOI: Silicon On Insulator), in particular usable without a triggering circuit.

BACKGROUND

In the field of microelectronics, an electrostatic discharge can occur throughout the lifetime of an integrated circuit and can constitute a significant problem with regard to the reliability of that integrated circuit, as well as a major cause of failure.

An electrostatic discharge generally results in a more or less large and more or less short current peak. An ESD protection device must therefore evacuate this current peak. Moreover, this current peak induces thermal stress in the protection device. A conventional ESD protection component comprises a triac.

The production of such a protection component using a technology of the solid substrate type easily allows the dissipation of the heat generated by the ESD pulse through the contacts and the solid substrate in which the protection component is produced.

This being so, other types of technology exist and, in particular, the technologies using a substrate of the silicon on insulator type. Such a substrate comprises a layer of silicon positioned on top of a buried substrate commonly referred to by those skilled in the art by the acronym "BOX" (Buried Oxide). The components are then produced in this layer of silicon.

In a partially depleted SOI technology (PDSOI: Partially Depleted SOI) with a 65 nm technology node, the thickness of the buried oxide is of the order of 145 nm and that of the layer of silicon on top of this buried oxide is of the order of 60 nm.

In a fully depleted SOI technology (FDSOI: Fully Depleted SOI), the thickness of the buried oxide is variable as is that of the layer of silicon. By way of example, the thickness of the buried oxide can be of the order of 145 nm and that of the layer of silicon on top of this buried oxide can be of the order of 7 nm. Lesser thicknesses are also possible, for example of the order of 10 or 20 nanometers for the buried oxide.

In an SOI technology, the presence of the buried oxide prevents the evacuation of heat in the downward direction, that is to say through the silicon situated under the buried oxide, thus reducing the volume available for this thermal evacuation. Moreover, in the FDSOI technology, the very small volume available has a negative impact on the reliability of the triacs formed in the thin upper layer of silicon.

Finally, in an SOI technology, and especially in the FDSOI technology, there can be up to six decades (orders of magnitude) of difference between the concentration of dopants in an N+ zone of a triac and that of an intrinsic P zone, which results in an extremely large depleted zone of the associated PN junction and therefore in a virtual absence of energy gap, which results in triggering voltages and holding voltages that can be very low and even lower than the power supply voltage of the device.

Moreover, in general, ESD protection devices of the triac type are associated with triggering circuits, for example MOS transistors whose gate and substrate are connected to earth (GGNMOS transistors), connected to their gate. This of course has a negative impact on the surface dimensions of the assembly. What is needed is a device that ameliorates or overcomes the shortcomings of the prior art.

SUMMARY OF THE INVENTION

According to one aspect, embodiments of the invention provide for a bidirectional semiconductor device for protection against electrostatic discharges, having two terminals. The device includes, within a layer of silicon on insulator, a central semiconductor zone. The zone includes a central region having a first type of conductivity and two intermediate regions having a second type of conductivity opposite to that of the first one, respectively disposed on either side of and in contact with the central region in order to form two PN junctions. The zone further includes two semiconductor end zones respectively disposed on either side of the central zone, each end zone comprising two end regions of opposite types of conductivity, in contact with the adjacent intermediate region, the two end regions of each end zone being mutually connected electrically in order to form the two terminals of the device. At least a first one of the two intermediate regions is configured to limit the volume of the depleted zone of at least one corresponding PN junction within the first intermediate region.

According to another aspect, embodiments of the invention provide for an integrated circuit, including at least one electrostatic discharge device. The integrated circuit comprises a silicon on insulator substrate, the substrate including a semiconductor layer having formed therein, the semiconductor layer including a central semiconductor zone. The central semiconductor zone includes a central region having a first type of conductivity and two intermediate regions having a second type of conductivity opposite to that of the first one, respectively disposed on either side of and in contact with the central region in order to form two PN junctions, The central zone further includes two semiconductor end zones respectively disposed on either side of the central zone, each end zone comprising two end regions of opposite types of conductivity, in contact with the adjacent intermediate region, the two end regions of each end zone being mutually connected electrically in order to form the two terminals of the device. At least a first one of the two intermediate regions is configured to limit the volume of the depleted zone of at least one corresponding PN junction within the first intermediate region.

BRIEF DESCRIPTION OF THE DRAWINGS

Other advantages and features of the invention will become apparent on examination of the detailed description of embodiments, which are no way limiting, and of the drawings in which.

DETAILED DESCRIPTION OF ILLUSTRATIVE EMBODIMENTS

Figure 1:
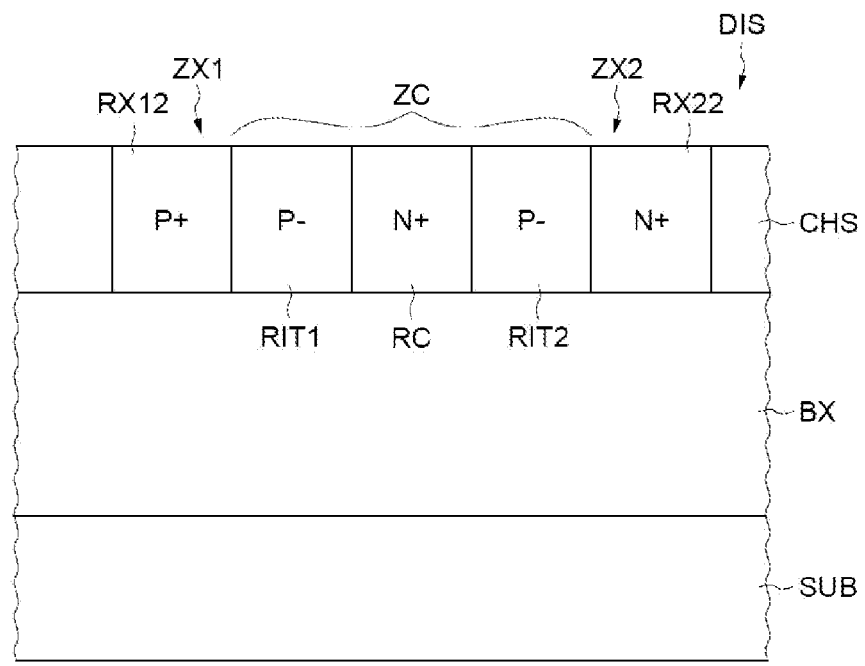
FIGS. 1 to 4 are diagrammatic illustrations of an embodiment of a device not comprising junctions having depleted zones limited in volume.

Before addressing the illustrated embodiments specifically, various embodiments and advantageous features thereof will be discussed generally in the following paragraphs.

According to an embodiment, there is proposed a bidirectional semiconductor device for protection against electrostatic discharges, capable of operating in a reliable manner, using an SOI technology, whether partially or fully depleted, without the use of a triggering circuit, whilst improving the thermal dissipation in the presence of an ESD pulse and having triggering and holding voltages compatible with the low power supply voltages.

According to one aspect, there is proposed a bidirectional semiconductor device for protection against electrostatic discharges, having two terminals and comprising, within a layer of silicon on insulator, a central semiconductor zone comprising a central region having a first type of conductivity, for example N type conductivity, two intermediate regions having a second type of conductivity opposite to that of the first one, for example P type conductivity, respectively disposed on either side of and in contact with the central region, two semiconductor end zones respectively disposed on either side of the central zone, each end zone comprising two end regions of opposite types of conductivity, in contact with the adjacent intermediate region, the two end regions of each end zone being mutually connected electrically in order to form the two terminals of the device.

Moreover, at least a first one of the two intermediate regions is configured in order to limit the volume of the depleted zone of at least one corresponding PN junction within the first intermediate region.

Thus according to this aspect the device comprises, within the same structure, two thyristors mutually connected in antiparallel with a common central zone. Moreover, when a first thyristor triggers under the effect of an ESD pulse having a certain polarity, the second thyristor is cut off but the various semiconductor regions which constitute it contribute to the dissipation of the thermal energy generated in the conducting thyristor. In other words, this second thyristor serves as a radiator for dissipating this thermal energy.

Moreover, in the presence of an ESD pulse having the opposite polarity, it is the second thyristor which triggers and the first one which serves as a radiator.

Moreover, the limitation of the volume of the depleted zone of the at least one corresponding PN junction within the intermediate region makes it possible to increase, in the energy band diagram, the energy gap which the carriers have to overcome in order to pass through and therefore allow the triggering of the device and consequently makes it possible to increase the triggering voltage and the holding voltage of the device.

A protection device is thus obtained which is triggerable in the presence of an ESD pulse without a triggering circuit and with an acceptable triggering voltage even in the presence of low power supply voltages.

There are several possibilities for limiting the volume of this depleted zone of the PN junction.

It is for example possible to insert, in the corresponding intermediate region, an auxiliary semiconductor region with a floating potential and having the same type of conductivity, for example conductivity of the P+ type, as that of the intermediate region and more heavily doped than this intermediate region, this auxiliary region extending perpendicular to the longitudinal direction of the device defined by its two terminals, along only a part of the central region.

The insertion of such an auxiliary region having a floating potential makes it possible to screen the depleted zone.

Several different embodiments of this auxiliary region are possible. Thus, it can comprise a full semiconductor wall extending perpendicular to the longitudinal direction along only a part of the central region or, for example, a discontinuous semiconductor wall.

Another possibility for limiting the volume of the depleted zone of the PN junction within the intermediate region consists of increasing the dimension of this intermediate region considered in the longitudinal direction of the device and, more particularly, in adjusting this dimension such that it is greater than the length of the depleted zone of the at least one corresponding PN junction, also considered in the longitudinal direction.

According to one embodiment, and particularly in order to ensure better symmetry of the device, the second intermediate region is also configured in order to limit the volume of the depleted zone of at least one corresponding PN junction within this second intermediate region.

The second intermediate region can comprise a second auxiliary region having at least one of the characteristics of the first auxiliary region such as defined above.

Moreover, here again, the dimension of this second intermediate region considered in the longitudinal direction of the device can be made greater than the length of the depleted zone of the at least one corresponding PN junction considered in the longitudinal direction.

The layer of silicon on insulator can be partially or fully depleted.

According to another aspect, there is proposed an integrated circuit comprising a device such as defined above.

Figure 2:
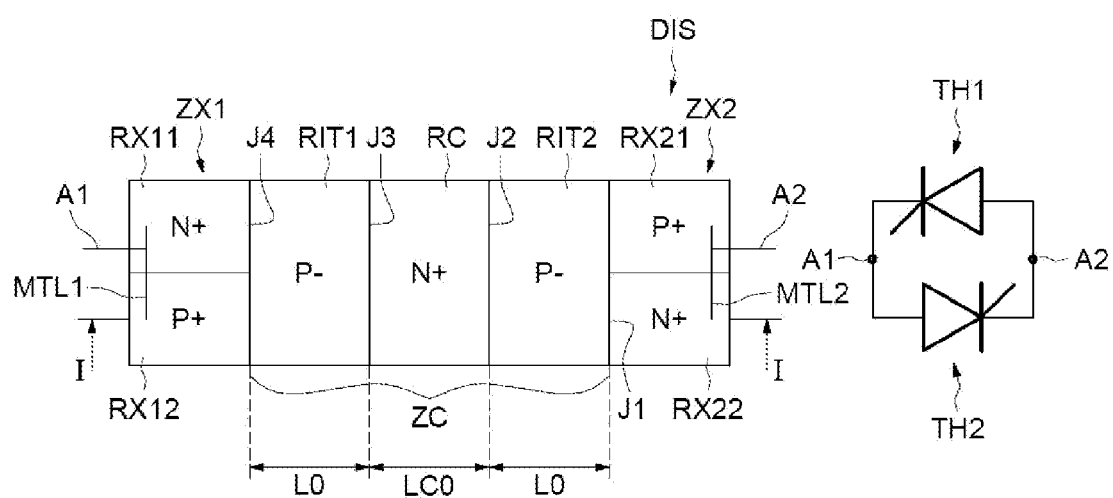

Turning now to the illustrated embodiments, in FIG. 1, which is a partial cross-section through the line I-I of FIG. 2, the device DIS is produced in Silicon on Insulator (SOI: Silicon On Insulator) technology. More precisely, an upper layer of silicon CHS is separated from a lower silicon substrate SUB by a buried layer of oxide BX.

The upper layer CHS can be partially depleted or fully depleted. In the example described in FIGS. 1 and 2, the layer CHS is fully depleted. The various semiconductor regions of the device DIS are produced in the upper layer CHS.

More precisely, the device comprises a central semiconductor zone ZC, comprising a central region RC having a first type of conductivity, in this case N type conductivity, and two intermediate regions RIT1, RIT2 having a second type of conductivity opposite to that of the first type, in this case P type conductivity, these two intermediate regions RIT1, RIT2 being respectively disposed on either side of the central region RC whilst being in contact with this central region in order to form two PN junctions, referenced J2 and J3 in FIG. 2.

In FDSOI technology, the intermediate regions RIT1, RIT2 are P− doped regions, typically having the same doping as that of the layer CHS, and the central region RC is an N+ doped region.

In PDSOI technology, the intermediate regions RIT1, RIT2 are P wells and the central region RC is an N well.

The device also comprises two end regions ZX1, ZX2, on either side of the central zone ZC. Each end zone comprises two end regions, having opposite types of polarity, in contact with the adjacent intermediate region.

More precisely, in the embodiment described here, the first end zone ZX1 comprises a first end region RX11 having N type conductivity and for example N+ doped whatever the type of SOI technology may be (FDSOI or PDSOI).

The first end zone ZX1 comprises a second end region RX12 having P type conductivity and for example P+ doped, whatever the type of SOI technology may be (FDSOI or PDSOI).

The first end region RX11 is in contact with the first intermediate region RIT1 of opposite conductivity type in order to form a PN junction referenced J4 in FIG. 2.

The second end region RX12 is in contact with the first intermediate region RIT1 of the same conductivity type in order to form a single semiconductor region of uniform conductivity type, namely, in this case, P type.

The two end regions RX11 and RX12 are moreover joined and electrically connected together, for example by a surface metal silicide, in order to form a first terminal A1 of the device.

The second end zone ZX2 comprises a first end region RX21 having P type conductivity and for example P+ doped whatever the type of SOI technology may be (FDSOI or PDSOI).

The second end zone ZX2 comprises an end region RX22 having N type conductivity and for example N+ doped whatever the type of SOI technology may be (FDSOI or PDSOI).

The second end region RX22 is in contact with the second intermediate region RIT2 of opposite conductivity type in order to form a PN junction, referenced J1 in FIG. 2.

The first end region RX21 is in contact with the second intermediate region RIT2 of the same conductivity type in order to form a single semiconductor region of uniform conductivity type, namely, in this case, P type.

The two end regions, RX21 and RX22, are moreover here joined and electrically connected together, for example by a surface metal silicide in order to form a second terminal A2 of the device.

Moreover, in the example described here, the end region of a first end zone having the first type of conductivity, for example the region RX11 having the N type conductivity, is disposed opposite the end region RX21 of the second end zone ZX2 having the P type conductivity.

Similarly, the other end region RX12 of the first end zone ZX1, which has the first type of conductivity, for example P type, is disposed opposite the end region RX22 of the second end zone ZX2 having N type conductivity.

These different semiconductor regions thus form, as shown on the right hand part of FIG. 2, two thyristors TH1 and TH2, connected in anti-parallel (head to tail).

More precisely, in the described example, the first thyristor TH1 comprises the region of uniform P type conductivity formed by the region RX21 and by the upper part (in FIG. 2) of the intermediate region RIT2, the upper part (in FIG. 2) of the central region RC, the upper part (in FIG. 2) of the intermediate region RIT1, and the end region RX11.

The second thyristor TH2 comprises the region of uniform P type conductivity formed by the region RX12 and by the lower part (in FIG. 2) of the intermediate region RIT1, the lower part (in FIG. 2) of the central region RC, the lower part (in FIG. 2) of the intermediate region RIT2, and the end region RX22.

Thus, when one of the thyristors is conducting following its triggering, for example in the presence of an ESD pulse, the other one is cut off but the corresponding semiconductor regions contribute to the dissipation of the thermal energy released by the conducting thyristor.

Figure 3:
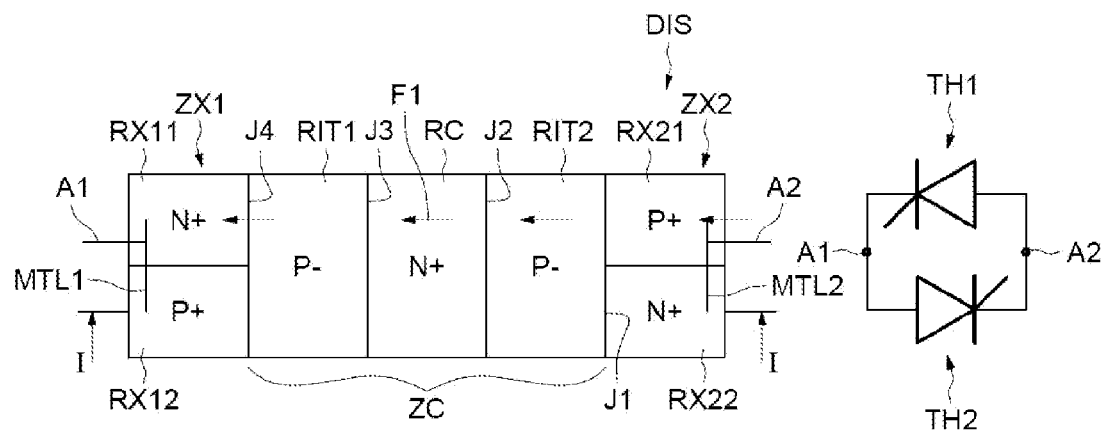
Figure 4:
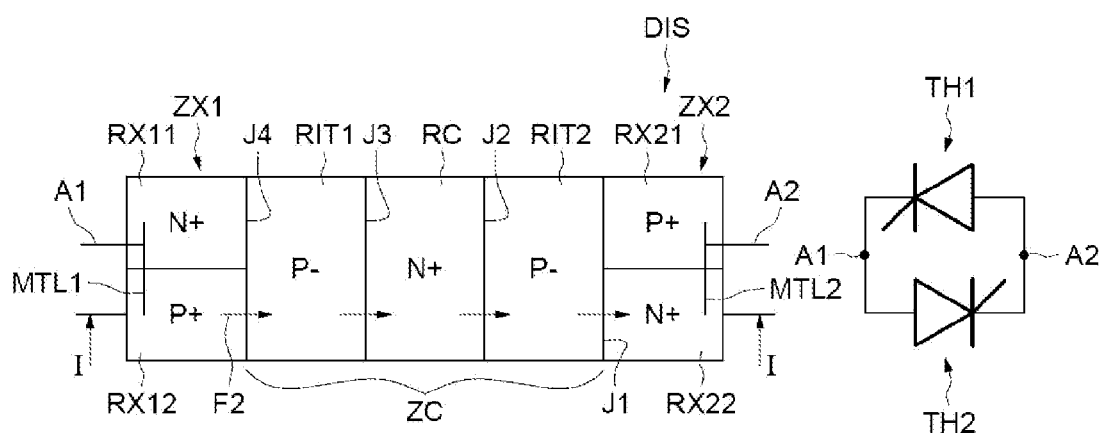

This is illustrated in FIGS. 3 and 4. More precisely, in FIG. 3, the thyristor TH1 is conducting (arrows F1) and the cut-off thyristor TH2 serves as a radiator. In FIG. 4 the thyristor TH2 is conducting (arrows F2) and the cut-off thyristor TH1 serves as a radiator.

In an SOI technology, the end regions RX21, RX22, RX11 and RX12 typically have a concentration of dopants of the order of $10^{20}$ to $10^{21}$ atoms per cm3, whereas the concentration of dopants of the intermediate regions RIT1 and RIT2 is of the order of $10^{15}$ atoms/cm3.

There is therefore a difference which can be as much as six decades between these two orders of magnitude. Moreover, the volume occupied by the intermediate regions RIT1 and RIT2 is much lower in an SOI technology than the volume of these same regions produced in a solid substrate technology. Moreover, this volume is even lower in a fully depleted SOI (FDSOI) technology in which the thickness of the layer CHS is much smaller than in the case of a partially depleted SOI (PDSOI) technology.

Consequently, taking account of the fact that the volume, and more particularly of the length, of the depleted zone of a PN junction depends on the concentration of dopants and, taking account of the low volume of the intermediate regions, the depleted zones of the junctions J1, J2, J3 and J4 are very large, and even larger in an FDSOI technology. Thus, the depleted zones of the junctions J1 and J2 result in a depleted zone extending almost or wholly over the length of the intermediate region RIT2 between the central region RC and the end region RX22. Because of this, there is very little or even no energy gap that the majority carriers passing between the central region RC and the region RX22 have to overcome. Moreover, this is even truer in FDSOI technology.

Consequently, the triggering voltage of such a device, that is to say the voltage applied between the terminals A1 and A2 after which the device begins to conduct, can be very low and even, in certain cases, lower than the power supply voltage of the integrated circuit including such a device.

In order to increase this triggering voltage and also the holding voltage, that it to say the minimum voltage for the device to remain conducting after having triggered, at least one of the two intermediate regions, and preferably both of the intermediate regions for reasons of symmetry, is configured to limit the volume of the depleted zone of at least one corresponding PN junction within that intermediate region.

This configuration can be obtained in different ways, as will now be explained in more detail with reference to FIGS. 5 to 12.

Figure 5:
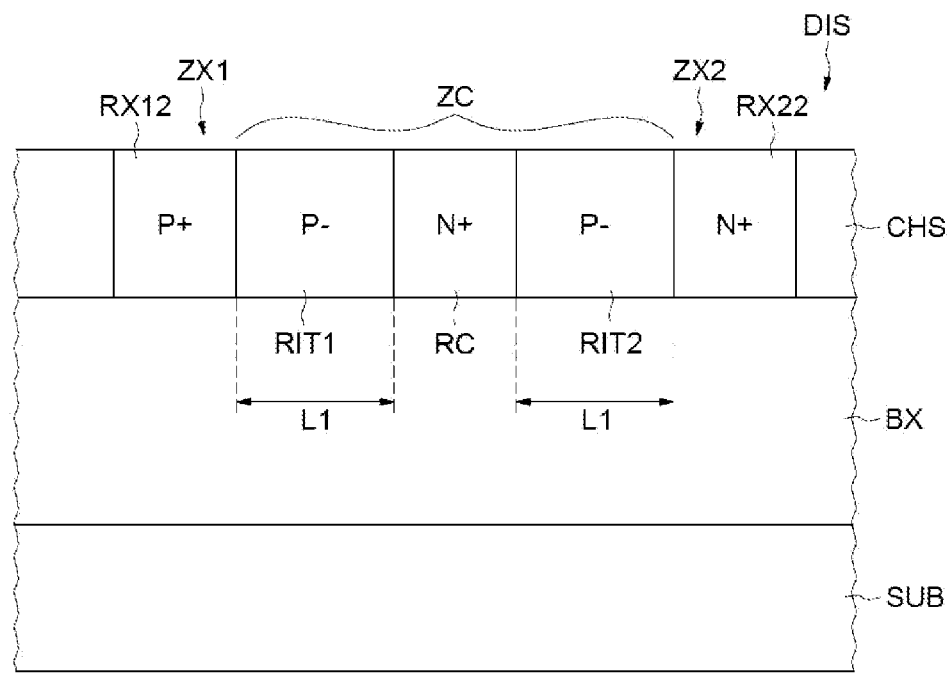
FIGS. 5 to 15 are diagrams relating to different embodiments of a device and of an integrated circuit according to the invention.
Figure 6:
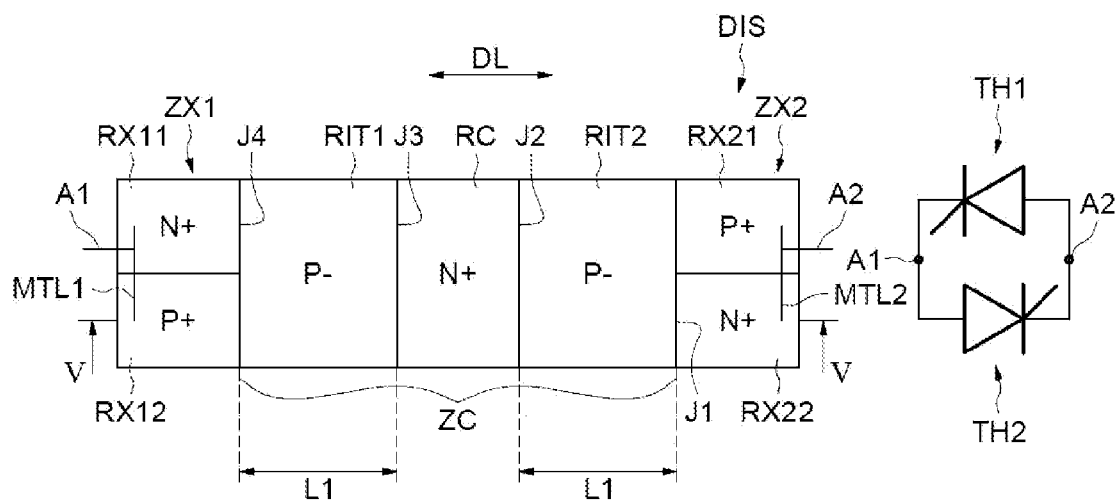

In FIGS. 5 and 6, the length L1 of the intermediate region RIT2, considered in the longitudinal direction DL of the device, is preferably chosen to be longer than the sum of the length of the depleted zone of the junction J2 within the region RIT2 and the length of the depleted zone of the junction J1 within the region RIT2.

It is recalled here that the length LZCE of a depleted zone (or space charge zone ZCE) of a PN junction is defined by the following formula:

$$LZCE = (2\epsilon Vbi((Nn+Np)/NnNp)/q)^{1/2}$$

Where qVbi is the potential barrier, Nn and Np are the concentrations of dopants in the P and N zones.

Those skilled in the art will therefore know how to adjust the length L1 according to these lengths of depleted zones determined by the formula.

Because of symmetry, the region RIT1 will then have the same length L1.

Figure 7:
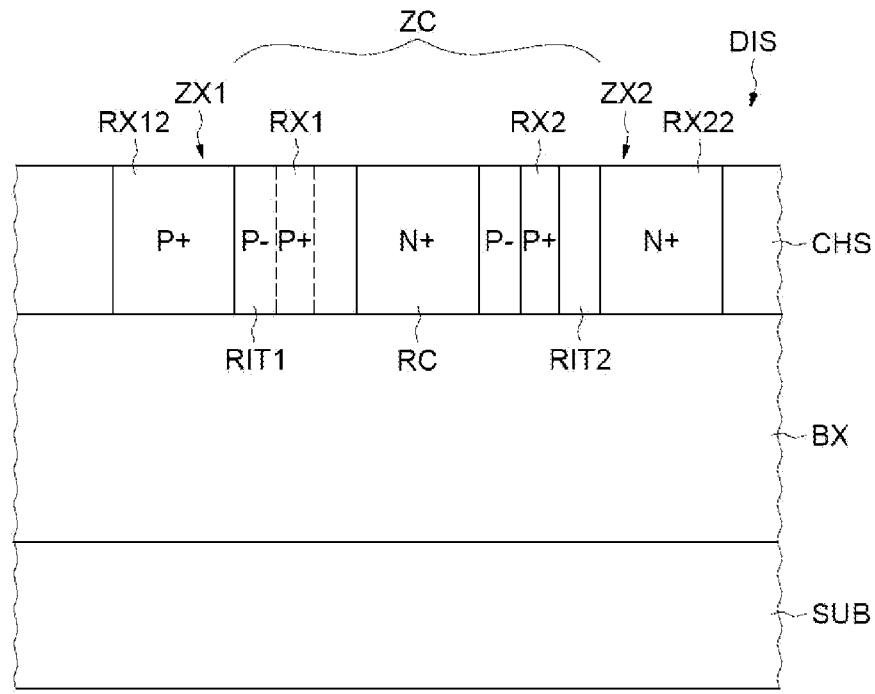
Figure 8:
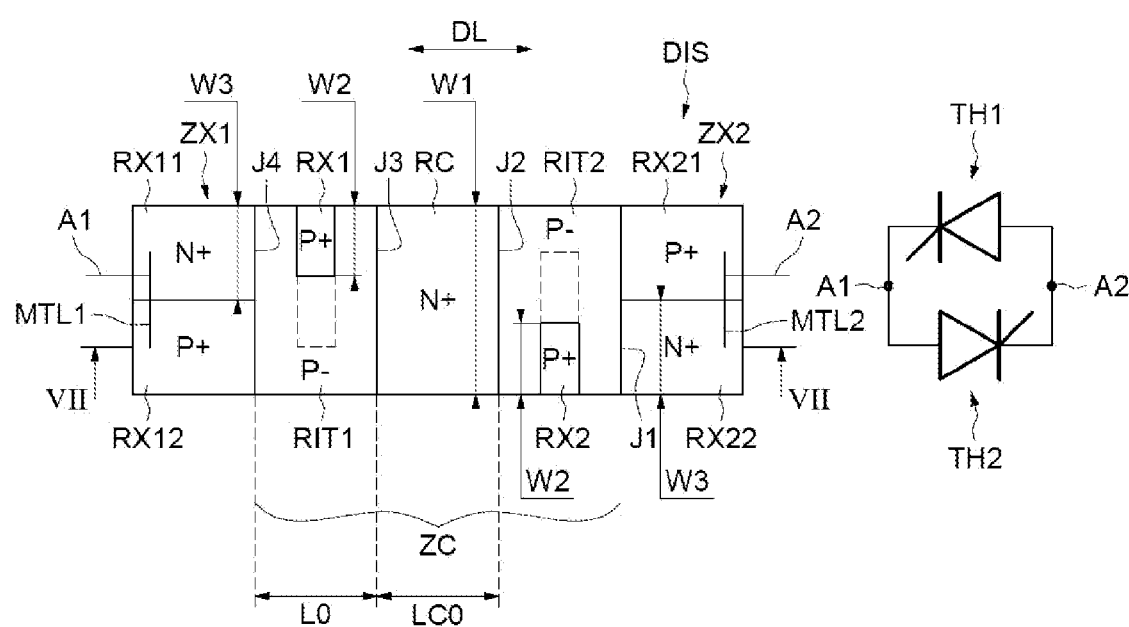

In FIGS. 7 (partial cross-section through the line VII-VII of FIG. 8) and 8, the first intermediate region RIT1 and the second intermediate region RIT2 each have an auxiliary semiconductor region RX1, RX2 of P type conductivity, more heavily doped than the rest of the intermediate region, and for example having the same doping as that of the end regions RX12 and RX21, for example $10^{21}$ atoms/cm3. These regions RX1, RX2 are floating potential regions.

In the example described here, the two auxiliary regions RX1 and RX2 are configured in order to be symmetrical with respect to the longitudinal axis of the device, even though this is not absolutely essential.

For purposes of simplification, only the geometry of the auxiliary region RX1 will therefore be described here.

This auxiliary region RX1 extends perpendicular to the longitudinal direction DL, opposite the end region RX11 and the central region N+, over a width W2 less than the width W3 of the end region RX11.

This being so, as illustrated in dashed line, this region RX1 could have a greater width whilst remaining less than the width W1 of the central region RC.

Moreover, this region RX1 extends over the same depth as the other regions of the device as far as the buried oxide BX.

With such a configuration, the depleted zones of the different junctions J3, J4, J2 and J1 are screened, which makes it possible to increase the potential barrier necessary for triggering the device.

Figure 9:
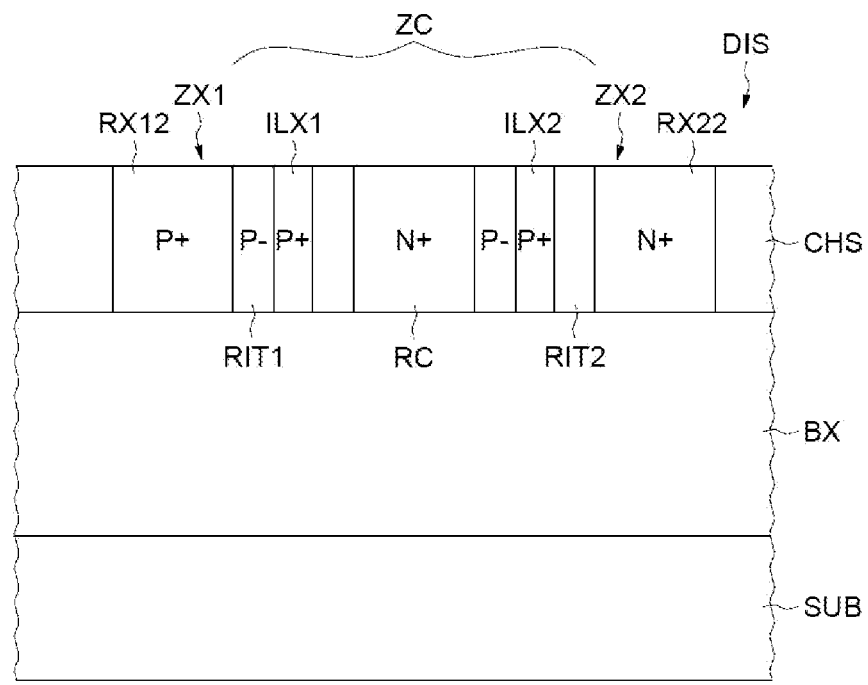
Figure 10:
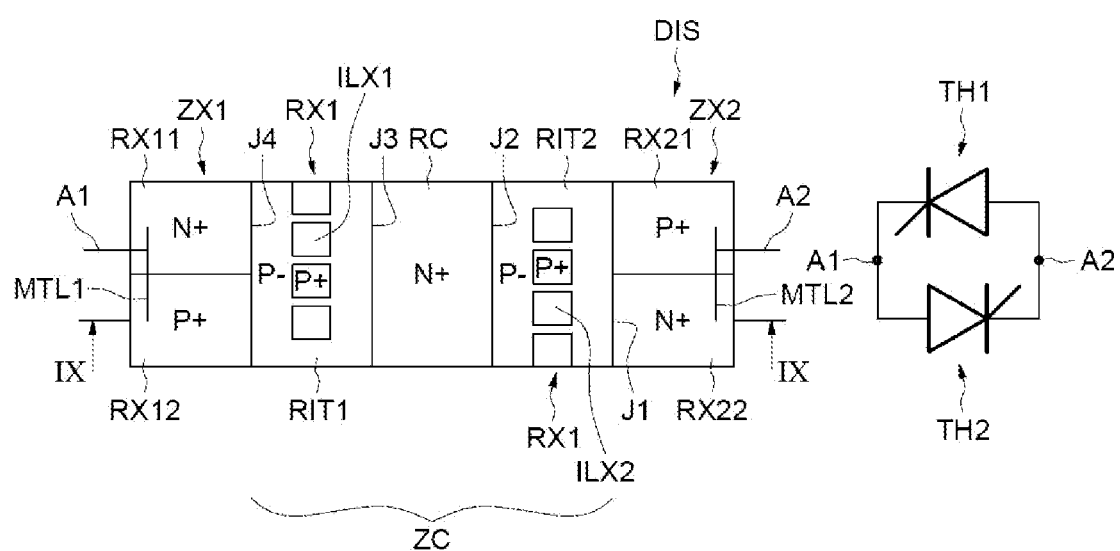

Although in FIGS. 7 and 8, the auxiliary regions RX1 and RX2 were formed by a continuous semiconductor wall extending partially within the intermediate regions RIT1 and RIT2, these regions RX1 and RX2 are, in the embodiment shown in FIGS. 9 (partial cross-section through the line IX-IX of FIG. 10) and 10, formed by a discontinuous semiconductor wall. In other words, the regions RX1 and RX2 are formed by semiconductor islands ILX1, ILX2, also P+ doped.

The discontinuous semiconductor walls RX1 and RX2 can extend along only a part of the central region RC as shown in FIG. 10, or over the whole of the length of the central region RC. Here again, these walls make it possible to screen the depleted zones of the corresponding junctions.

Figure 11:
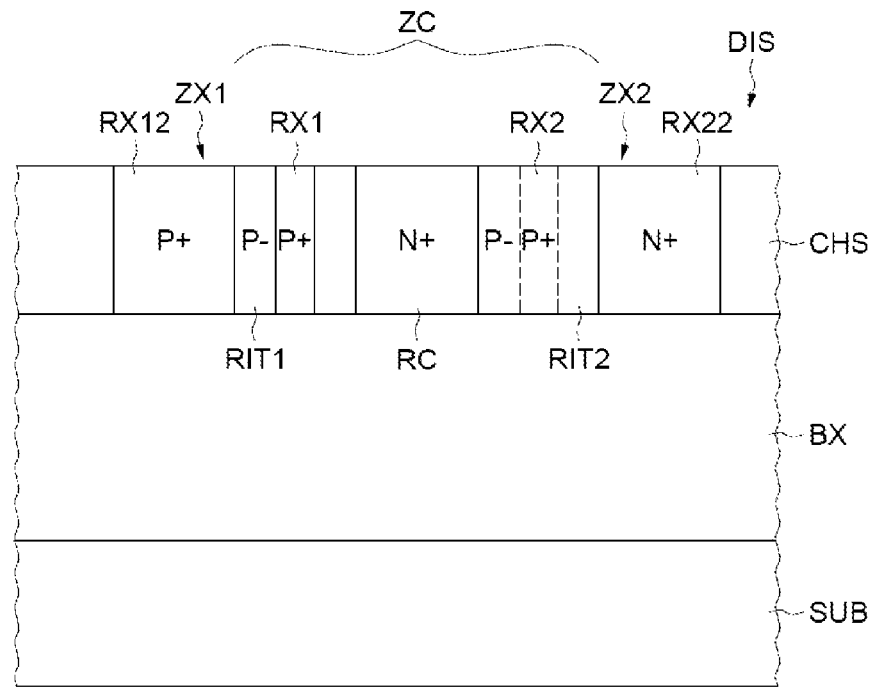
Figure 12:
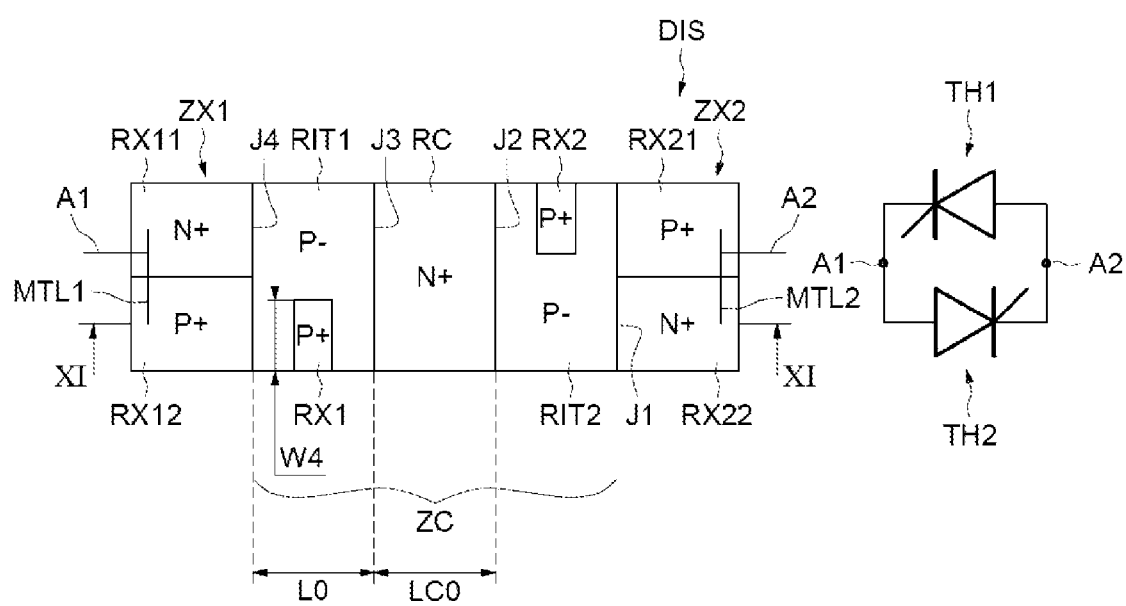

Although in FIGS. 7 and 8 for example, the regions RX1 and RX2 preferably extend opposite the end regions RX11 and RX22, that is to say N+ doped regions, these regions RX1 and RX2 extend, in the embodiment shown in FIGS. 11 (partial cross-section through the line XI-XI of FIG. 12) and 12, partly opposite the regions RX12 and RX21 which are P+ doped, in such a way as to screen only the depleted zone of the junction J3 and the depleted zone of the junction J2.

Other embodiments are possible. It is for example possible to insert several continuous or discontinuous semiconductor walls with, in the latter case, an arrangement of semiconductor islands in staggered rows.

Figure 13:
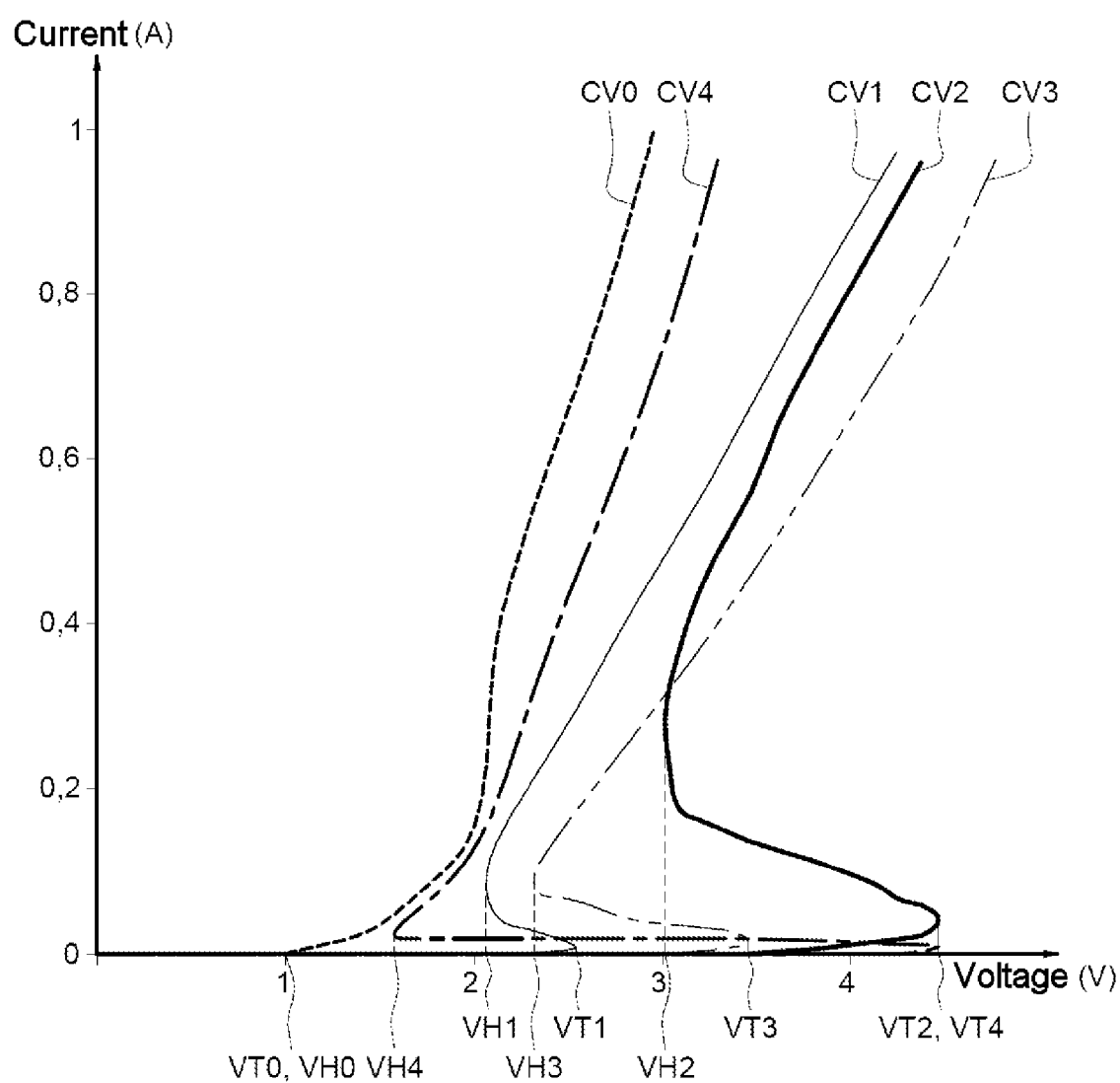

FIG. 13 shows curves representing the variation of the current passing through the device as a function of the voltage between the terminals A1 and A2. All of these curves in fact illustrate the functioning of a single thyristor of the device DIS.

The curve CV0 relates to a device of the type shown in FIGS. 1 and 2, with a doping of $10^{21}$ atoms/cm3 for the P+ and N+ doped regions and a doping of 1015 atoms/cm3 for the P− doped regions. Moreover, the length L0 of the regions RIT1 and RIT2 is equal to 170 nm as is the length LC0 of the central region RC.

The curve CV1 is representative of a device of the type shown in FIGS. 5 and 6, that is to say with wider zones RIT1 and RIT2. The dopings are identical to those of the device shown in FIGS. 1 and 2 and the value L1 is equal to 500 nm.

The curve CV2 is representative of a device of the type shown in FIGS. 7 and 8, with a wall RX2 (for example) extending within the region RIT2. The dopings of the N+, P+ and P− regions are identical to those mentioned above, and the doping of the region RX2 is also equal to $10^{21}$ atoms/cm3.

The lengths L0 and LC0 are identical to those of FIG. 2, and the values W2 and W3 (equal to W1/2) are equal to 1 micrometer and 3 micrometers respectively.

The curve CV3 is representative of a device of the type shown in FIGS. 9 and 10 with the same dimensions as those of FIG. 8 and a number of P+ islands (auxiliary regions RX1 or RX2) equal to 4. The width of each island (considered in the direction perpendicular to DL) is equal to 0.5 micrometers.

Finally, the curve CV4 is representative of a device of the type shown in FIGS. 11 and 12, with the same dimensions as those of FIG. 8 and with a width W4 for the region RX1 equal to 1 micrometers.

An increase of the triggering voltage VTi with respect to the triggering voltage VT0 of the device shown in FIGS. 1 and 2 is therefore observed for all of the structures according to the various embodiments of the invention described above.

Similarly, the holding voltage VH is also greater for the devices according to the invention.

Figure 14:
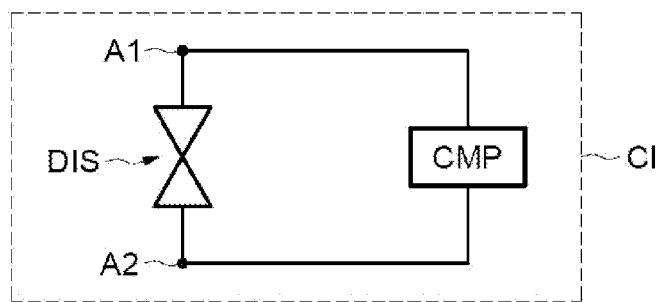

As shown in FIG. 14, the device DIS can be used as a protection from ESD in order to protect a component CMP. The device DIS is then connected to the two terminals of the component CMP.

Figure 15:
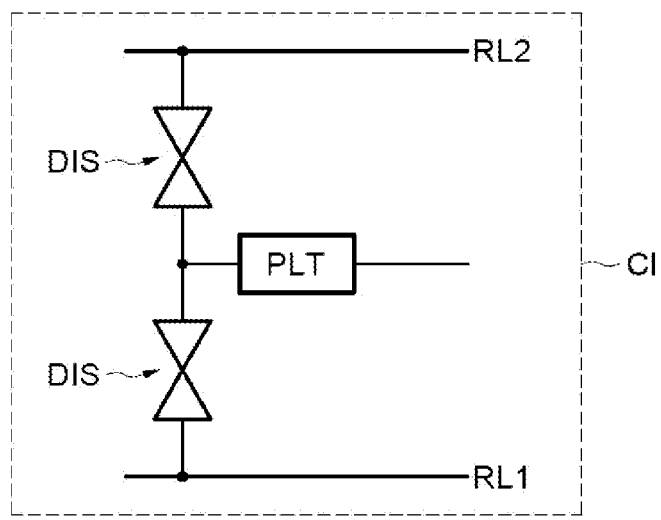

As shown in FIG. 15, it is also possible to protect contacts, for example output contacts PLT of an integrated circuit CI, by connecting a device DIS between the contact PLT and a power supply bus RL2, and by connecting another device DIS between the contact PLT and an earth bus RL1.

What is claimed is:

1. A bidirectional semiconductor device for protection against electrostatic discharges, the device having two terminals and comprising:
    a layer of silicon on insulator; and
    a central semiconductor zone within the layer of silicon on insulator, the central semiconductor zone comprising
        a central region having a first type of conductivity,
        first and second intermediate regions having a second type of conductivity opposite to that of the first type of conductivity, the first and second intermediate regions respectively disposed on either side of and in contact with the central region in order to form two PN junctions, and
        first and second semiconductor end zones respectively disposed on either side of the central zone, each end zone comprising two end regions of opposite types of conductivity, in contact with the adjacent intermediate region, the two end regions of each end zone being mutually connected electrically in order to form the two terminals of the device,
    wherein the two terminals of the device define a longitudinal direction for the device and the first intermediate region comprises a first auxiliary semiconductor region with a floating potential, the first auxiliary semiconductor region having the second type of conductivity and being more heavily doped than other portions of the first intermediate region, the first auxiliary semiconductor region extending perpendicular to the longitudinal direction along only a part of the central region.

2. The device according to claim 1, wherein the first auxiliary region has a same doping concentration as that of the end zone in contact with the intermediate region and further has the same type of conductivity.

3. The device according to claim 1, wherein the first auxiliary region comprises at least one full semiconductor wall extending perpendicular to the longitudinal direction along only a part of the central region.

4. The device according to claim 1, wherein the first auxiliary region comprises at least one discontinuous semiconductor wall extending perpendicular to the longitudinal direction along at least a part of the central region.

5. The device according to claim 1, wherein the first auxiliary region extends perpendicular to the longitudinal direction along only a part of the central region and only opposite the end zone in contact with the first intermediate region and having the same type of conductivity as that of the central region.

6. The device according to claim 1, wherein the first auxiliary region extends perpendicular to the longitudinal direction along only a part of the central region and only opposite the end zone in contact with the first intermediate region and having the opposite type of conductivity to that of the central region.

7. The device according to claim 1, wherein the first auxiliary region extends perpendicular to the longitudinal direction along only a part of the central region and opposite the two end zones in contact with the first intermediate region.

8. The device according to claim 1, wherein the second of the two intermediate regions is configured to limit the volume of the depleted zone of at least one corresponding PN junction within the second intermediate region.

9. The device according to claim 8, wherein the second intermediate region comprises a second auxiliary region that comprises a second auxiliary semiconductor region with a floating potential, the second auxiliary semiconductor region having the same type of conductivity as that of the second intermediate region and being more heavily doped than the second intermediate region.

10. The device according to claim 8, wherein the two terminals of the device define a longitudinal direction for the device and the dimension of the second intermediate region considered along the longitudinal direction is greater than the length of the depleted zone of the at least one corresponding PN junction considered along the longitudinal direction.

11. The device according to claim 1, wherein the two terminals of the device define a longitudinal direction for the device and the dimension of the first intermediate region considered along the longitudinal direction is greater than the length of the depleted zone of the at least one corresponding PN junction considered along the longitudinal direction.

12. The device according to claim 1, wherein the layer of silicon on insulator is partially or fully depleted.

13. An integrated circuit, including at least one electrostatic discharge device, the integrated circuit comprising:
a silicon on insulator substrate, the substrate including a semiconductor layer, the semiconductor layer including a central semiconductor zone having:
  a central region having a first type of conductivity,
  two intermediate regions having a second type of conductivity opposite to that of the first one, respectively disposed on either side of and in contact with the central region in order to form two PN junctions,
  two semiconductor end zones respectively disposed on either side of the central zone, each end zone comprising two end regions of opposite types of conductivity, in contact with the adjacent intermediate region, the two end regions of each end zone being mutually connected electrically in order to form two terminals of the device,
wherein at least a first one of the two intermediate regions comprises a first auxiliary semiconductor region having the second type of conductivity and being more heavily doped than remaining portions of the first one of the two intermediate regions, the first auxiliary semiconductor region extending across only a part of the first one of the two intermediate regions.

14. The integrated circuit of claim 13 wherein the silicon on insulator substrate includes a first substrate having a buried oxide layer formed thereon and the semiconductor layer formed on the buried oxide.

15. The integrated circuit of claim 14 wherein the buried oxide layer has a thickness of about 145 nm.

16. The integrated circuit of claim 14 wherein the buried oxide layer has a thickness of from about 10 nm to about 20 nm.

17. A semiconductor device comprising:
a semiconductor layer disposed over an insulating layer;
a central region having a first conductivity type formed in the semiconductor layer;
a first intermediate region having a second conductivity type formed in the semiconductor layer contacting a first edge of the central region, the second conductivity type opposite the first conductivity type, wherein the first intermediate region comprises a first auxiliary semiconductor region with a floating potential, the first auxiliary semiconductor region having the second conductivity type and being more heavily doped than remaining portions of the first intermediate region, the first auxiliary semiconductor region extending perpendicular to a longitudinal direction along only a part of the central region;
a second intermediate region having the second conductivity type formed in the semiconductor layer contacting a second edge of the central region, the second edge opposite the first edge;
a first semiconductor end zone formed in the semiconductor layer so that the first intermediate region is between the first semiconductor end zone and the central region, the first semiconductor end zone comprising a first end zone region and a second end zone region overlying the first end zone region, the first and second end zone regions having opposite conductivity types, the first and second end zone regions both contacting the first intermediate region; and
a second semiconductor end zone formed in the semiconductor layer so that the second intermediate region is between the second semiconductor end zone and the central region, the second semiconductor end zone comprising a third end zone region and a fourth end zone region overlying the third end zone region, the third and fourth end zone regions having opposite conductivity types, the third and fourth end zone regions both contacting the second intermediate region.

18. The device according to claim 17, further comprising a first terminal electrically connected to the first and second end zone regions and a second terminal electrically connected to the third and fourth end zone regions.

19. The device according to claim 18, wherein the first and second terminals of the device define the longitudinal direction for the device.

20. The device according to claim 17, wherein the first auxiliary region comprises at least one full semiconductor wall extending perpendicular to the longitudinal direction along only a part of the central region.

21. The device according to claim 17, wherein the first auxiliary region comprises at least one discontinuous semiconductor wall extending perpendicular to the longitudinal direction along at least a part of the central region.

22. The device according to claim 17, wherein the first auxiliary region extends perpendicular to the longitudinal direction along only a part of the central region and only opposite the end zone in contact with the first intermediate region and having the opposite type of conductivity to that of the central region.

\* \* \* \* \*